(12) United States Patent
Lin et al.

(10) Patent No.: US 7,925,487 B2
(45) Date of Patent: Apr. 12, 2011

(54) REPLAYING DISTRIBUTED SYSTEMS

(75) Inventors: Wei Lin, Beijing (CN); Xuezheng Liu, Beijing (CN); Zheng Zhang, Beijing (CN)

(73) Assignee: Microsoft Corporation, Redmond, WA (US)

( * ) Notice: Subject to any disclaimer, the term of this patent is extended or adjusted under 35 U.S.C. 154(b) by 704 days.

(21) Appl. No.: 11/771,934

(22) Filed: Jun. 29, 2007

(65) Prior Publication Data

US 2009/0006064 A1  Jan. 1, 2009

(51) Int. Cl.
*G06F 17/50* (2006.01)

(52) U.S. Cl. ........................................................ 703/13

(58) Field of Classification Search .................... 703/13; 700/9, 10, 20
See application file for complete search history.

(56) References Cited

U.S. PATENT DOCUMENTS

| | | | |
|---|---|---|---|
| 5,371,746 A | 12/1994 | Yamashita et al. | |
| 5,768,591 A | 6/1998 | Robinson | |
| 5,933,639 A | 8/1999 | Meier et al. | |
| 5,999,734 A * | 12/1999 | Willis et al. | 717/149 |
| 6,042,614 A | 3/2000 | Davidson et al. | |
| 6,058,393 A | 5/2000 | Meier et al. | |
| 6,083,281 A | 7/2000 | Diec et al. | |
| RE36,852 E | 9/2000 | Heinen | |
| 6,324,683 B1 | 11/2001 | Fuh et al. | |
| 6,470,388 B1 | 10/2002 | Niemi et al. | |
| 6,961,926 B2 | 11/2005 | Koyama | |
| 7,039,014 B1 | 5/2006 | Krishnamurthy et al. | |
| 7,096,264 B2 | 8/2006 | Bonney et al. | |
| 7,096,459 B2 | 8/2006 | Keller et al. | |
| 7,133,820 B2 | 11/2006 | Pennello et al. | |
| 7,185,319 B2 | 2/2007 | Kaler et al. | |
| 2002/0174415 A1 | 11/2002 | Hines | |
| 2003/0135400 A1 * | 7/2003 | Mellander | 705/7 |
| 2006/0004862 A1 * | 1/2006 | Fisher et al. | 707/104.1 |
| 2007/0014248 A1 | 1/2007 | Fowlow | |

OTHER PUBLICATIONS

Geels, et al., "Friday: Global Comprehension for Distributed Replay", available at least as early as Apr. 20, 2007, at <<http://berkeley.intel-research.net/maniatis/publications/NSDI2007Friday.pdf>>, NSDI, 2007, pp. 1-14.

Joyce, et al., "Monitoring Distributed Systems", available at least as early as Apr. 20, 2007, at <<http://pharos.cpsc.ucalgary.ca/Dienst/Repository/2.0/Body/ncstrl.ucalgary_cs/1985-213-26/pdf>>, ACM, vol. 5, No. 2, May 1987, pp. 121-150.

Rabenseifner, "The Controlled Logical Clock—a Global Time for Trace Based Software Monitoring of Parallel Applications in Workstation Clusters", available at least as early as Apr. 20, 2007, at <<http://elib.uni-stuttgart.de/opus/volltexte/1999/59/pdf/59.pdf, IEEE, 1996, pp. 1-8.

Garg, et al., "Detection of Strong Unstable Predicates in Distributed Programs", available at least as early as Apr. 19, 2007, at <<http://www.ece.utexas.edu/~garg/dist/tpds96.ps>>, pp. 1-20.

(Continued)

*Primary Examiner* — Jason Proctor
*Assistant Examiner* — Andre Pierre Louis
(74) *Attorney, Agent, or Firm* — Lee & Hayes, PLLC

(57) ABSTRACT

Replaying distributed systems involves playing a distributed system in a simulator using data from a real-world operation. In an example embodiment, a simulation process is to simulate a distributed system that has a first instance and a second instance. The simulation process includes a first simulation object corresponding to the first instance and a second simulation object corresponding to the second instance. In another example embodiment, communications between the first instance and the second instance are simulated within the simulation process using function calls between the first simulation object and the second simulation object.

18 Claims, 8 Drawing Sheets

OTHER PUBLICATIONS

Mittal, et al., "Debugging Distributed Programs Using Controlled Re-execution", available at least as early as Apr. 19, 2007, at <<http://delivery.acm.org/10.1145/350000/343624/p239-mittal.pdf?key1=343624&key2=7792696711&coll=GUIDE&dl=GUIDE&CFID=16819920&CFTOKEN=59133013>>, ACM, 2000, pp. 239-248.

Tarafdar, et al., "Predicate Control for Active Debugging of Distributed Programs", available at least as early as Apr. 19, 2007, at <<http://www.ece.utexas.edu/~garg/dist/spdp98.ps>>, pp. 1-7.

Killian, et al., "Life, Death, and the Critical Transition: Finding Liveness Bugs in Systems Code," USENIX Association, NSDI '07, 4th USENIX Symposium on Networked Systems Design & Implementation, 2007, pp. 243-256.

Singh, et al., "Using Queries for Distributed Monitoring and Forensics," Appears in EuroSys, Leuven, Belgium, Apr. 2006, pp. 1-14.

Sen et al., "Formal Verification of Simulation Traces Using Computation Slicing", IEEE Transactions on Computers, vol. 56, No. 4, Apr. 2007, pp. 511-527.

* cited by examiner

Example Method for Simulating a Distributed System

REPLAYING DISTRIBUTED SYSTEMS

BACKGROUND

Distributed systems can involve many nodes. In fact, these nodes can number in the tens, hundreds, thousands, millions or more nodal instances. Each instance may be, for example, a process, an application, a physical device, some combination thereof, and so forth. The individual nodes of a distributed system can operate interactively with one other, with two other, or with many other nodes of the distributed system. Such interactions may occur once or be repeated.

The many nodes of a distributed system usually communicate messages between and amongst each other. Each node also functions locally by acting on local resources. These various actions and interactions result in many different non-deterministic concurrences happening within the distributed system. As a result of these concurrent events and the sheer number of nodal instances, bugs in distributed systems are usually difficult to analyze. It is even more difficult to diagnose and/or identify the cause or causes of bugs in distributed systems.

SUMMARY

Replaying distributed systems involves playing a distributed system in a simulator using data from a real-world operation. In an example embodiment, a simulation process is to simulate a distributed system that has a first instance and a second instance. The simulation process includes a first simulation object corresponding to the first instance and a second simulation object corresponding to the second instance. In another example embodiment, communications between the first instance and the second instance are simulated within the simulation process using function calls between the first simulation object and the second simulation object. In yet another example embodiment, data from a real-world operation of the distributed system for each instance is memory-mapped such that each respective data file can be switched into simulation process memory space when the simulation process switches so as to simulate each respective instance.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Moreover, other method, system, scheme, apparatus, device, media, procedure, API, arrangement, etc. implementations are described herein.

BRIEF DESCRIPTION OF THE DRAWINGS

The same numbers are used throughout the drawings to reference like and/or corresponding aspects, features, and components.

DETAILED DESCRIPTION

Introduction to Replaying Distributed Systems

Figure 1:
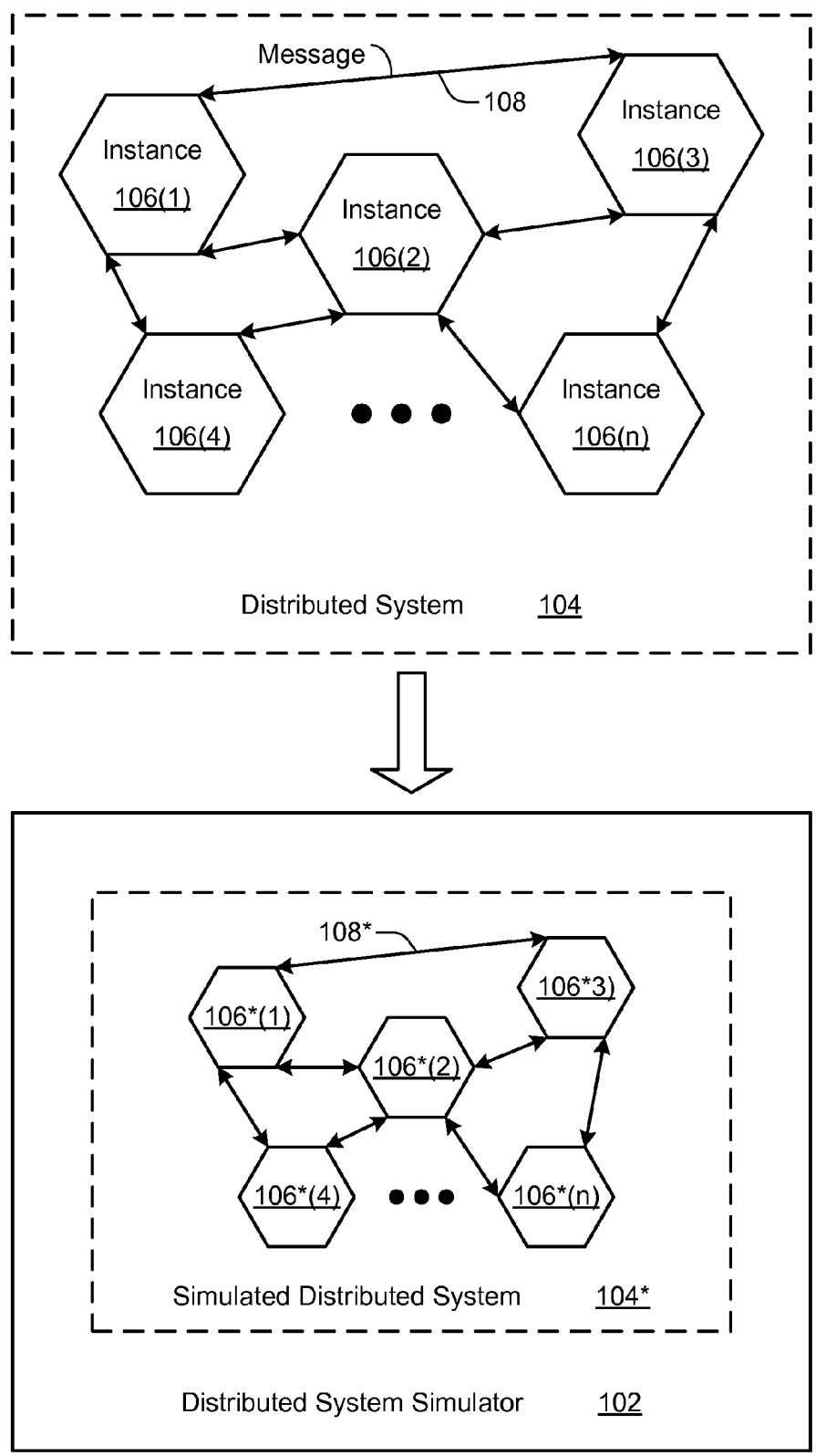
FIG. 1 is a block diagram of an example distributed system and a distributed system simulator that may be used to perform a simulation.

One paradigm for debugging distributed systems is to employ replay technology. With replay technology, trace logs are recorded while the real-world distributed system operates. The trace logs can record such things as inputs, memory states, and so forth. Inputs can include non-deterministic inputs such as received messages, random number generations, and so forth. The nodal instances of the distributed system are then simulated in a replay manner by applying respective trace logs to respective instances. Conflicts and other inconsistencies may be detected between the trace logs and the simulated instances.

A distributed simulation may be accomplished using the following group-replay approach: Each respective instance, which is often simulating a real-world process, may be simulated with a respective process. With this approach, real-world messages between simulated instances are realized in the simulation as local process communications (LPCs), or inter-process calls. To enforce the correct "happens-before" ordering, a separate controller process is created as part of the simulation. This controller process also exchanges LPCs with other processes.

However, the approach described above entails a number of disadvantages. For example, each process consumes some level of resources (e.g., memory, kernel space, etc.), so the number of instances that can be simulated per device is relatively limited. Secondly, LPCs between two processes involve operating system calls, which are time consuming. Third, the code executing each process for each instance is redundantly duplicated. Fourth, the operating system's scheduler, in conjunction with the process controlling the simulation, introduces additional overhead. Fifth, it is likely that there are many memory swaps from disk to random access memory (RAM). These and other disadvantages can limit the scalability and/or performance of group-replay using the above-described approach.

In contrast, certain embodiments as described herein can improve performance and/or scalability. Any given single implementation may include one or more of the following example aspects. These example aspects are presented in the context of the following example embodiment: Each instance of multiple instances of a distributed system is simulated by a single simulation process. For example, each respective instance may correspond to a respective simulation object of the simulation process. A simulation controller may also be part of the simulation process. Consequently, there are fewer process-level resources being consumed. The distributed system replaying may be accomplished with one set of process information and process code segment. Furthermore, messages between simulated instances may be simulated with function calls, which are relatively fast.

Moreover, instance states from the trace logs and/or simulated states during the replaying may be implemented as memory-mapped files. In addition to potentially reducing disk-swapping, the memory space of the simulation process may be redirected to the memory-mapped file corresponding to the instance currently being simulated. These example aspects and other aspects, as well as alternative aspects, of multiple different embodiments are described further herein below with particular reference to FIGS. 2-7.

EXAMPLE EMBODIMENTS FOR REPLAYING DISTRIBUTED SYSTEMS

Introduction—Example Environments and Overview

FIG. 1 is a block diagram 100 of an example distributed system 104 and a distributed system simulator 102 that may be used to perform a simulation. As illustrated, distributed system 104 includes multiple instances 106. Specifically, "n" instances 106(1), 106(2), 106(3), 106(4) ... 106(n), with "n" representing some integer, are part of distributed system 104. Instances 106 send/receive, and otherwise exchange, messages 108 between the nodal instances.

In an example embodiment, each instance 106 may be a process, an application, a part of an application, a physical device, a part of a physical device, a protocol implementation, a module formed from processor-executable instructions, some combination thereof, and so forth. Each instance may comprise a node of distributed system 104. Nodes, and thus instances 106, may be co-located within a single application and/or physical device, located in different applications and/or physical devices, located in the same or different networks, and so forth. By way of example only, each instance 106 may be a peer entity of a peer-to-peer (P2P) network.

As illustrated, distributed system simulator 102 includes simulated distributed system 104*. Simulated distributed system 104* includes simulated instances 106*(1 ... n) and simulated messages 108*. In an example embodiment, distributed system simulator 102 performs a simulation on distributed system 104 to produce simulated distributed system 104*. This simulation may involve a replaying of distributed system 104. An example replaying is described herein below with particular reference to FIG. 2.

Figure 2:
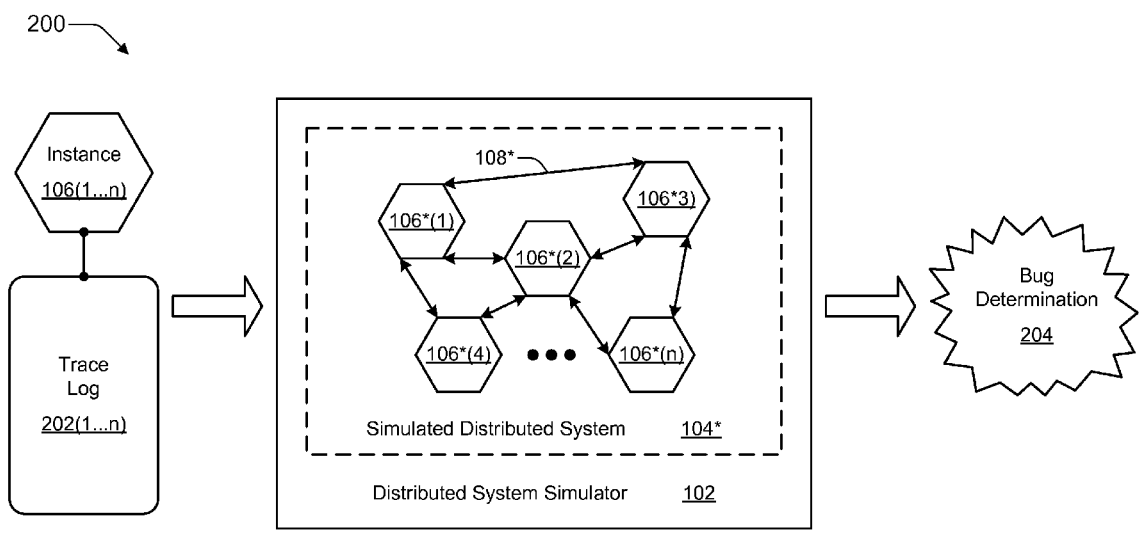
FIG. 2 is a block diagram of an example distributed simulation that enables replay and that includes a distributed system simulator as well as example inputs and results.

FIG. 2 is a block diagram of an example distributed simulation 200 that enables replay and that includes a distributed system simulator 102 as well as example inputs and results. As illustrated, the inputs are applied to distributed system simulator 102 on the left, and the results are output from distributed system simulator 102 on the right. Inputs include multiple respective instances 106(1 ... n) of distributed system 104 and multiple respective trace logs 202(1 ... n). Results can include at least one bug determination 204.

In an example embodiment, distributed system 104 is operated in the real world and trace events are logged into trace logs 202(1 ... n). These trace logs 202 are collected from the different real-world instances 106 and input into distributed system simulator 102. By way of example, but not limitation, such trace logs 202 can include nondeterministic events, such as messages received from the network, data read from files, thread scheduling decisions, environmental system calls, etc.; memory address allocations, heap relinquishments, etc.; system times, random number generation, etc.; and so forth.

In operation, trace logs 202 are replayed by distributed system simulator 102. For example, during a replay, events from different instances 106 are collected from trace logs 202, sequentialized into a total execution order based on a logical clock, and re-executed one-by-one in distributed system simulator 102. More specifically, the executable binary may be rerun inside the simulator with, e.g., non-deterministic events being fed from trace logs 202.

Distributed system simulator 102 produces simulated states of instances 106. It can also produce inconsistencies between the simulated states and logged states as evidence of potential bugs. Comparisons between the simulated states and the logged states may be performed manually or may be performed automatically by distributed system simulator 102. From the inconsistencies, one or more bugs can be detected and identified to thereby make a bug determination 204. After determining the existence and makeup of a bug, a developer or other programmer can create and apply a fix to instances 106 of distributed system 104.

Generally, an example embodiment of distributed system simulator 102 may function as follows: One simulation process is used to replay instances 106(1 ... n). File-mapping is used to handle memory switches between different instances. For instance, the state of an instance is stored in a memory mapped file, and it is mapped into the process memory space on-demand. Thus, to switch the replayed instance from A to B, the entries in a page table of the simulation process may be updated to the base address of the mapped memory of instance B. The simulation process aspect is described herein below with particular reference to FIGS. 3 and 4. The memory-mapping aspect is described herein below with particular reference to FIGS. 5-7. These example aspects may be used separately or together.

Example Simulation Process Embodiments

Figure 3:
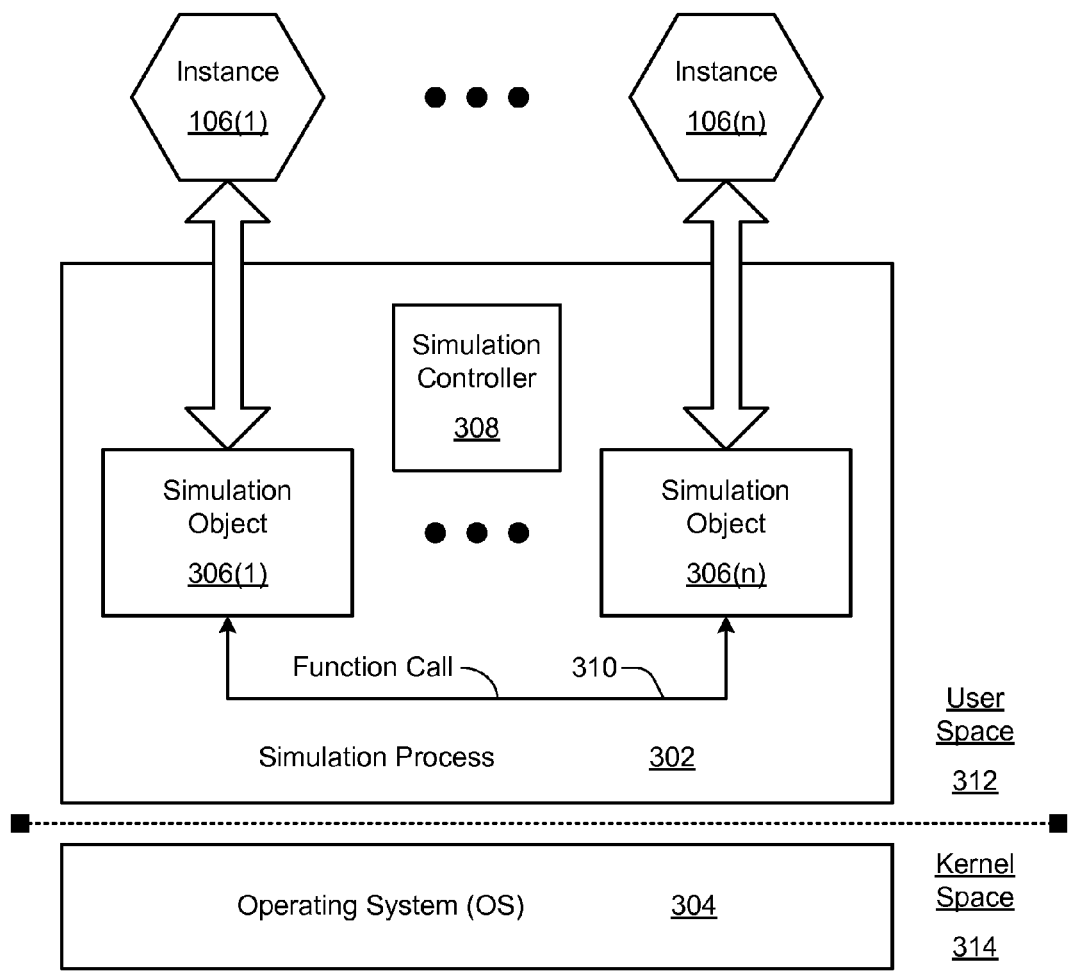
FIG. 3 is a block diagram of an example scheme for replaying a distributed system as part of a distributed system simulation.

FIG. 3 is a block diagram of an example scheme 300 for replaying a distributed system as part of a distributed system simulation. As illustrated, scheme 300 includes a simulation process 302 and an operating system (OS) 304. Simulation process 302 includes multiple simulation objects 306, at least one simulation controller 308, and one or more function calls 310.

In an example embodiment, simulation process 302 executes in a user space 312. Operating system 304 executes in a kernel space 314. Generally, scheme 300 can be employed to replay a distributed system 104 using trace logs 202 (of FIG. 2) that are derived from a real-world operation of multiple instances 106(1 ... n). With scheme 300, a simulation is performed for "n" respective instances 106(1) ... 106(n) using "n" respective simulation objects 306(1) ... 306(n).

As illustrated, the "n" instances 106(1 ... n) of distributed system 104 are simulated by "n" simulation objects 306(1 ... n) that are each within a single simulation process 302. Alternatively, "x" simulation objects 306 may be simulated in "n/x" different simulation processes 302, with "x" representing an integer having a value of two or greater. When two or more simulation objects 306 are created and/or present within a given simulation process 302, communications between any such two simulation objects 306 may be implemented with function calls.

Thus, intra-process communications can be realized as function calls. Function calls 310 between two simulation objects 306 can simulate real-world communications (e.g., as recorded by trace logs 202) between two instances 106. Function calls 310 can also be used for other communications between two simulation objects 306. Function calls 310 can be realized, by way of example only, as thread-level calls. Consequently, they can be made without relying on a slower operating system call.

Function calls 310 can also be used for communication exchanges involving simulation controller 308. Simulation controller 308 is responsible for orchestrating the simulation of distributed system 104. Simulation controller 308 controls the application of trace logs 202 as the replaying simulation unfolds. It is responsible for the temporal ordering of events and thus maintains the "happens-before" relationships that occurred during the real-world operation. By way of example only, a logical clock such as Lamport's logical clock may be employed.

Instructions and other communications from (and responses to) simulation controller 308 can also be implemented within simulation process 302 as function calls 310. This can be more efficient than making calls to the operating system. Moreover, simulation controller 308 can avoid some measure of conflict with the operating system's scheduling efforts by relying on user-level scheduling instead of kernel-level scheduling.

Figure 4:
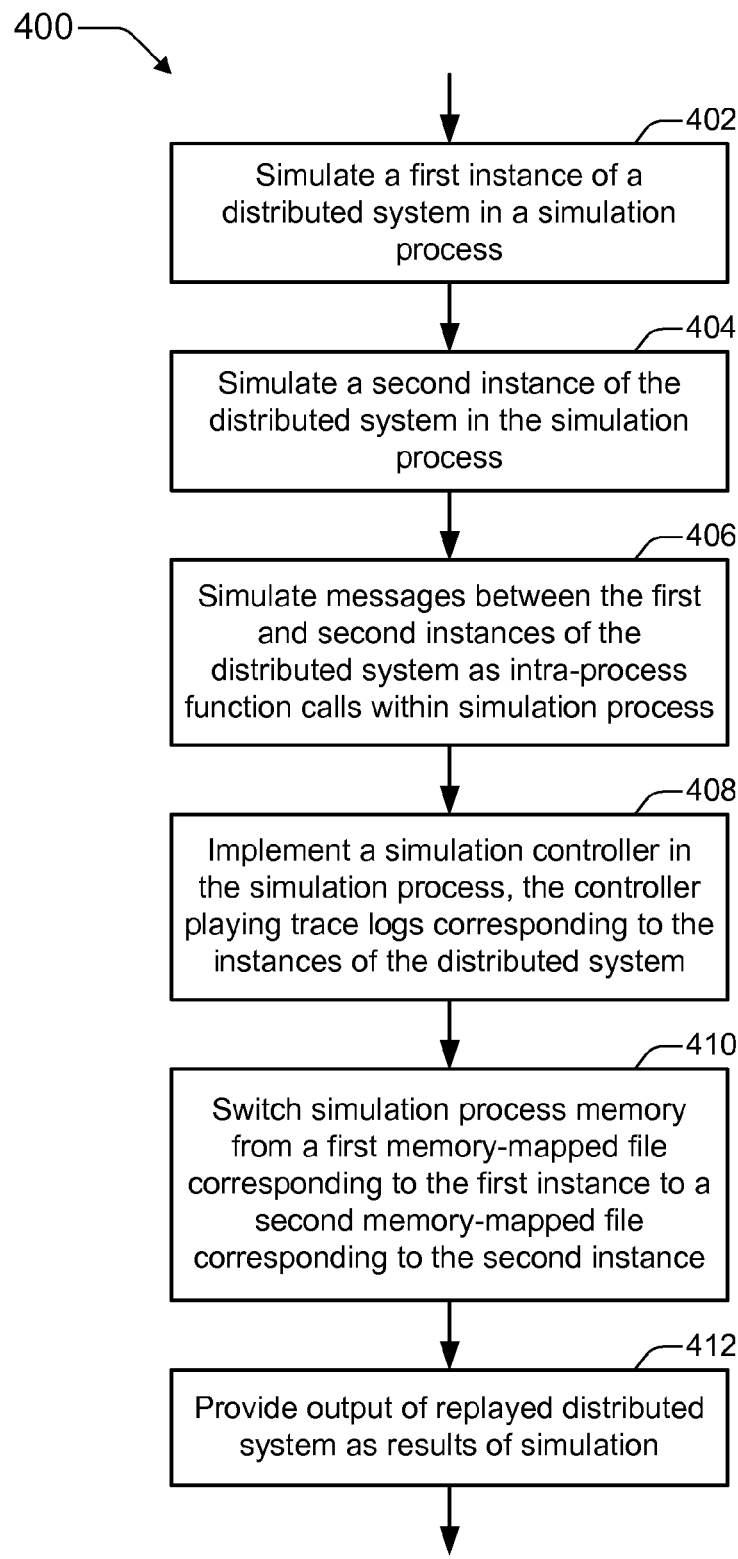
FIG. 4 is a flow diagram that illustrates an example of a method for replaying a distributed system as part of a distributed system simulation.
Figure 7:
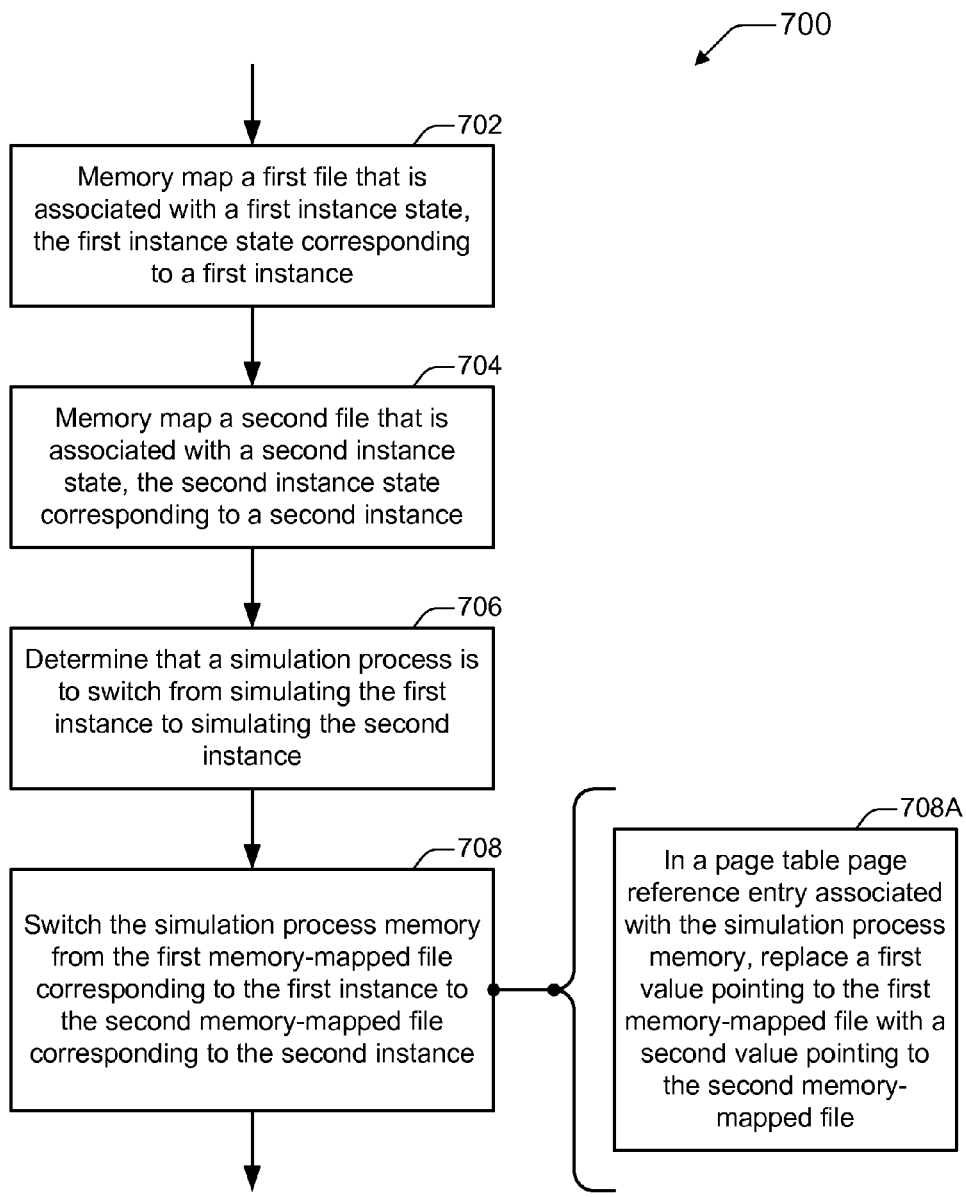
FIG. 7 is a flow diagram that illustrates an example of a method for using memory when replaying a distributed system as part of a distributed system simulation.

In the drawings, FIGS. 4 and 7 are flow diagrams 400 and 700, respectively. Implementations of flow diagrams 400 and 700 may be realized, for example, as processor-executable instructions. Processor-executable instructions may be embodied as software, firmware, hardware, fixed logic circuitry, some combination thereof, and so forth. The acts of these flow diagrams may be performed in many different environments, by one or more of a number of different devices, and/or with a variety of operating system and/or middleware configurations. Hence, although the descriptions of certain blocks and the acts thereof reference other elements that are described herein, they do so by way of example only. The order in which the methods are described is not intended to be construed as a limitation, and any number of the described blocks can be combined, augmented, rearranged, and/or omitted to implement a respective method, or an alternative method that is equivalent thereto.

FIG. 4 is a flow diagram 400 that illustrates an example of a method for replaying a distributed system as part of a distributed system simulation. Flow diagram 400 includes six (6) blocks 402-412. In an example embodiment, at block 402, a first instance of a distributed system is simulated in a simulation process. For example, a first instance 106(1) of a distributed system 104 may be simulated in a simulation process 302. First instance 106(1) may be simulated by, for instance, a first simulation object 306(1).

At block 404, a second instance of the distributed system is simulated in the simulation process. For example, a second instance 106(2) of distributed system 104 may be simulated in simulation process 302. Second instance 106(2) may be simulated by, for instance, a second simulation object 306(2) (a simulation object 306(2) is implicitly, but not explicitly, shown in FIG. 3).

At block 406, messages between the first and second instances of the distributed system are simulated as intra-process function calls within the simulation process. For example, messages 108 between first and second instances 106(1) and 106(2) of distributed system 104 may be simulated as intra-process function calls 310 within simulation process 302. The function calls, by way of example only, may be thread calls, and they may avoid making an operating system call.

At block 408, a simulation controller is implemented in the simulation process, with the simulation controller playing trace logs corresponding to the first and second instances of the distributed system. For example, a simulation controller 308 may be implemented within simulation process 302. Simulation controller 308 may play respective first and second trace logs 202(1,2) that correspond to respective first and second instances 106(1,2) of distributed system 104. Simulation controller 308 may ensure that the temporal order of events as they occurred in the real-world operation of distributed system 104 is maintained during the simulated replaying operation of simulated distributed system 104*.

At block 410, simulation process memory is switched from a first memory-mapped file corresponding to the first instance to a second memory-mapped file corresponding to the second instance. First and second memory-mapped files that correspond respectively to first and second instances 106(1) and 106(2), as well as simulation process memory switching, are described in relative detail herein below in the following section with particular reference to FIGS. 5-7. Generally, a replaying simulation involves the following three parts occupying virtual memory space: process information, a data segment, and a code segment. The data from trace logs 202 may be mapped on demand into RAM. As the replaying unfolds, respective trace log data for respective simulation instances are mapped into the data segment when the code segment is to process a given simulation instance.

At block 412, the output of the replayed distributed system is provided as the results of a simulation. For example, output resulting from the replaying of a distributed system 104 by a distributed system simulator 102 may be the simulated states of multiple instances 106, may be inconsistencies between simulated states and trace-logged states, some combination thereof, and so forth.

Example Memory Usage Embodiments

Figure 5:
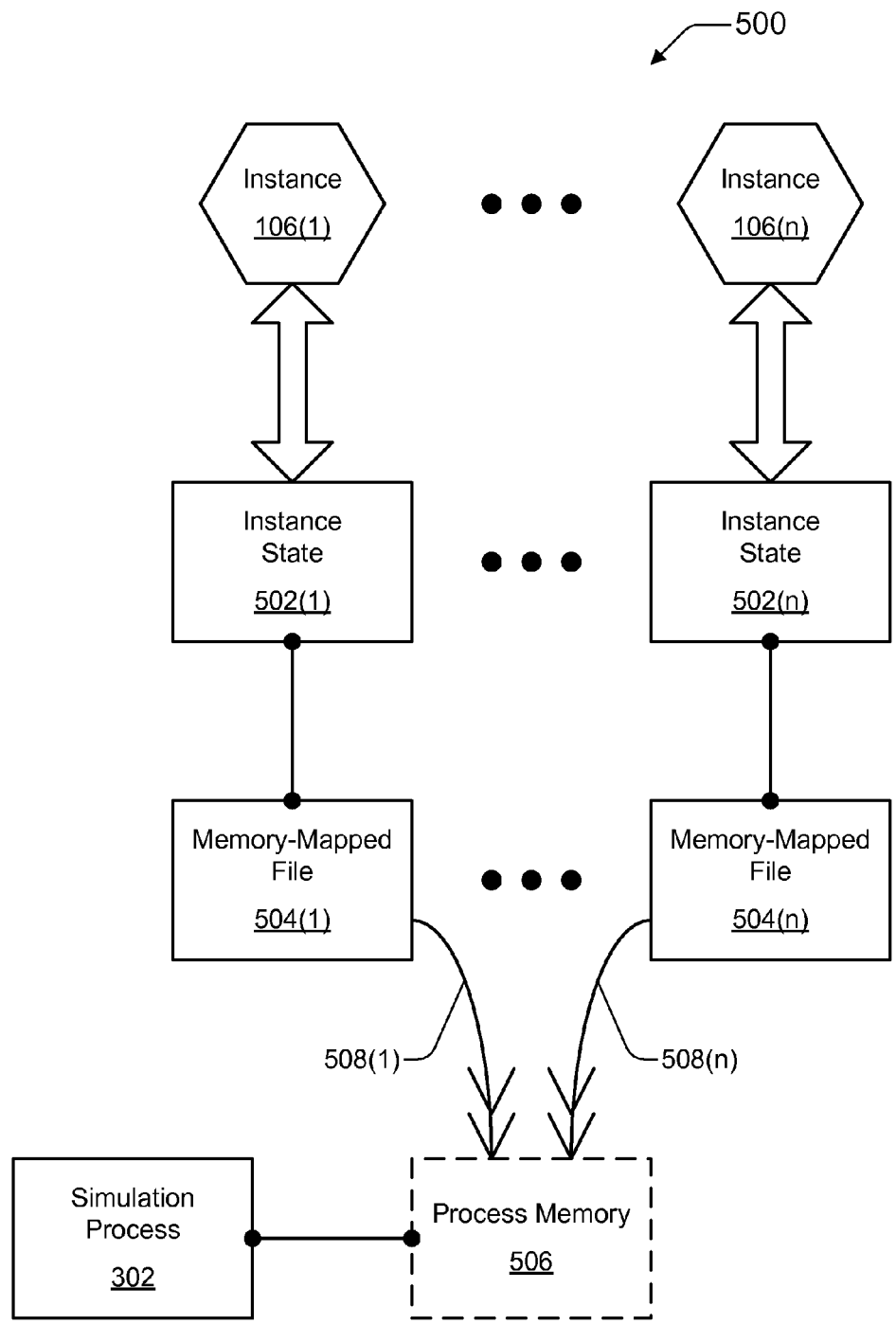
FIG. 5 is a block diagram of an example memory usage scheme that may be implemented when replaying a distributed system as part of a distributed system simulation.

FIG. 5 is a block diagram of an example memory usage scheme 500 that may be implemented when replaying a distributed system as part of a distributed system simulation. As illustrated, memory usage scheme 500 involves instances 106(1) . . . 106(n) and includes simulation process 302, "n" instance states 502(1) . . . 502(n), "n" memory-mapped files 504(1) . . . 504(n), and process memory 506. Scheme 300 (of FIG. 3) and memory usage scheme 500 may be used separately or together in any given simulation performed by a distributed system simulator.

In an example embodiment, each respective instance 106 (1) . . . 106(n) corresponds to a respective instance state 502(1) . . . 502(n). Each respective instance state 502(1) . . . 502(n) is associated with a respective memory-mapped file 504(1) . . . 504(n). Simulation process 302 is associated with simulation process memory 506. Generally, simulation process 302 can be directed to a different memory-mapped file 504 by switching 508 which memory-mapped file 504 is currently assigned to be process memory 506. This memory switching or mapping 508 is performed when simulation process 302 switches from simulating one instance 106 (e.g., with a simulation object 306) to simulating another instance 106 (e.g., with another simulation object 306).

More specifically, each instance state 502 includes the data from a trace log 202 of a corresponding instance 106 and/or the current simulated state of the corresponding instance 106. The contents of instance state 502 are memory-mapped to a file to create memory-mapped file 504. For example, the contents of a disk-based file having instance state 502 may be mapped and moved into a RAM-based file having instance state 502. This memory-mapped file 504 can usually be accessed more quickly.

As illustrated, each memory-mapped file 504(1) . . . 504(n) may be switched 508(1) . . . 508(n) into being process memory 506. In other words, memory accesses to simulation process memory 506 by simulation process 302 may be redirected or mapped 508 to a desired memory-mapped file 504. An example technique for implementing such a memory redirection is described herein below with particular reference to FIG. 6.

Figure 6:
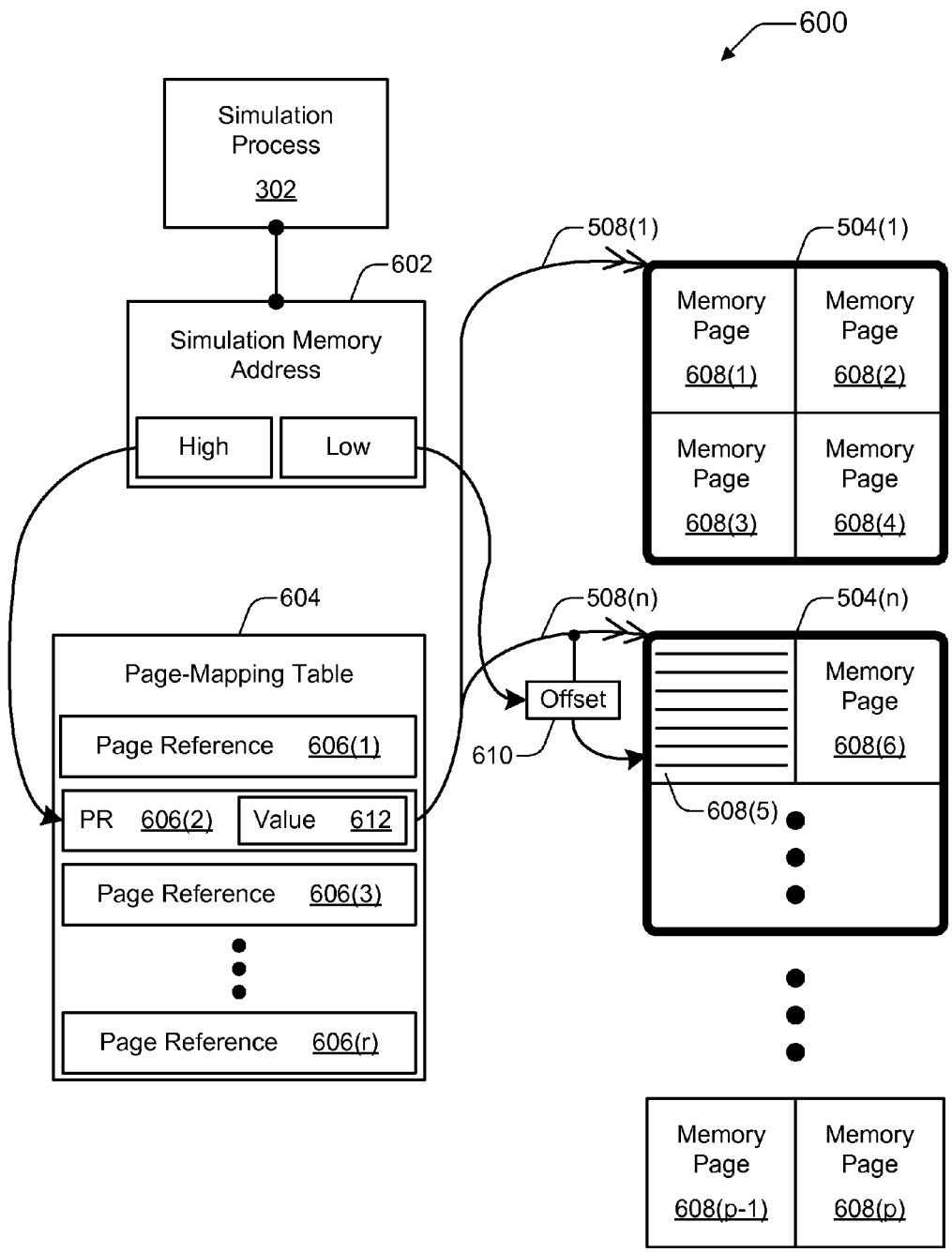
FIG. 6 is a block diagram of an example technique for implementing the memory usage scheme of FIG. 5.

FIG. 6 is a block diagram of an example technique 600 for implementing the memory usage scheme of FIG. 5. As illustrated, technique 600 involves simulation process 302, a simulation memory address 602, a page-mapping table 604, page reference entries 606, memory pages 608, an offset 610, and a page reference value 612. Memory redirections 508(1) and 508(n) to memory-mapped files 504(1) and 504(n), respectively, are also shown. In an example embodiment generally, changing page reference value 612 redirects simulation process 302 to consider a different memory area to be simulation process memory 506.

More specifically, for an example embodiment, a virtual memory paradigm is implemented by an operating system 304 (of FIG. 3) on which a distributed system simulator 102 is running. With the virtual memory paradigm, memory is divided into pages 608 and swapped from disk to RAM to increase the total apparent amount of RAM on the device. As illustrated, the memory is separated into "p" pages of memory 608(1), 608(2), 608(3), 608(4), 608(5), 608(6) ... 608(p–1), 608(p), with "p" being some integer.

Page-mapping table 604 is used to map memory addresses to different pages. Page mapping table 604 includes "r" page reference entries 606(1), 606(2), 606(3) ... 606(r), with "r" being some integer. Each value 612 in a page reference entry 606 points to a memory page 608.

Although virtual memory paradigms may be implemented in a variety of manners, the following describes virtual memory by way of example but not limitation: Memory-mapped file 504(1) is associated with a memory area having memory pages 608(1,2,3,4), starting with memory page 608(1). Memory-mapped file 504(n) is associated with a memory area having memory pages 608(5,6, ... ), starting with memory page 608(5).

In an example virtual memory operation, a simulation memory address 602 is divided into a high portion and a low portion. The high portion references or points to a page reference entry 606(2) of page-mapping table 604. At one time, value 612 of page reference entry 606(2) points to memory page 608(1), which directs simulation process 302 at arrow 508(1) to memory-mapped file 504(1). This corresponds to a simulation of first instance 106(1).

At another time, the simulation of distributed system 104 switches to instance 106(n), which corresponds to simulation of another instance 106(n). To accommodate this switching of instances 106 that are being simulated, simulation process memory 506 (of FIG. 5) is to be switched to memory-mapped file 504(n). Value 612 of page reference entry 606(2) is changed so that it references or points to memory page 608(5). This effectively redirects simulation process 302 at arrow 508(n) to memory-mapped file 504(n). The low portion of simulation memory address 602 is usually used as an offset 610 within a given page 608. For a typical 32-bit MICROSOFT WINDOWS operating system implementation, by way of example only, adjusting value 612 can entail changing 8 bytes of memory while adjusting a whole page can entail changing 4 kilobytes of memory.

FIG. 7 is a flow diagram 700 that illustrates an example of a method for using memory when replaying a distributed system as part of a distributed system simulation. Flow diagram 700 includes five (5) blocks 702-708, with block 708 also including block 708A. In an example embodiment, at block 702, a first file that is associated with a first instance state is memory mapped, with the first instance state corresponding to a first instance. For example, a first instance state 502(1) corresponding to a first instance 106(1) may be memory-mapped to create a first memory-mapped file 504(1).

At block 704, a second file that is associated with a second instance state is memory mapped, with the second instance state corresponding to a second instance. For example, a second instance state 502(2) corresponding to a second instance 106(2) may be memory-mapped to create a second memory-mapped file 504(2) (a second instance state 502(2) and a memory-mapped file 504(2) are implicitly, but not explicitly, shown in the drawings).

At block 706, it is determined that a simulation process is to switch from simulating the first instance to simulating the second instance. For example, a distributed system simulator 102 (and/or a simulation controller 308 thereof) may determine that simulation process 302 is to switch from simulating first instance 106(1) to simulating second instance 106(2).

At block 708, simulation process memory is switched from the first memory-mapped file corresponding to the first instance to the second memory-mapped file corresponding to the second instance. For example, simulation process memory 506 of simulation process 302 may be switched or redirected from first memory-mapped file 504(1) corresponding to first instance 106(1) to second memory-mapped file 504(2) corresponding to second instance 106(2).

Block 708A describes example act(s) for implementing the act(s) of block 708. At block 708A, in a page table page reference entry associated with the simulation process memory, a first value pointing to the first memory-mapped file is replaced with a second value pointing to the second memory-mapped file. For example, in a page-mapping table 604, at a page reference entry 606(2) that is associated with a simulation process memory 506 (e.g., via at least a portion of a simulation memory address 602), a first value 612 that points 508(1) to first memory-mapped file 504(1) is replaced with a second value 612 that points 508(2) to second memory-mapped file 504(2) (a pointing or directing 508(2) is implicitly, but not explicitly, shown in the drawings by way of the variable "n").

Example Device Implementations for Replaying Distributed Systems

Figure 8:
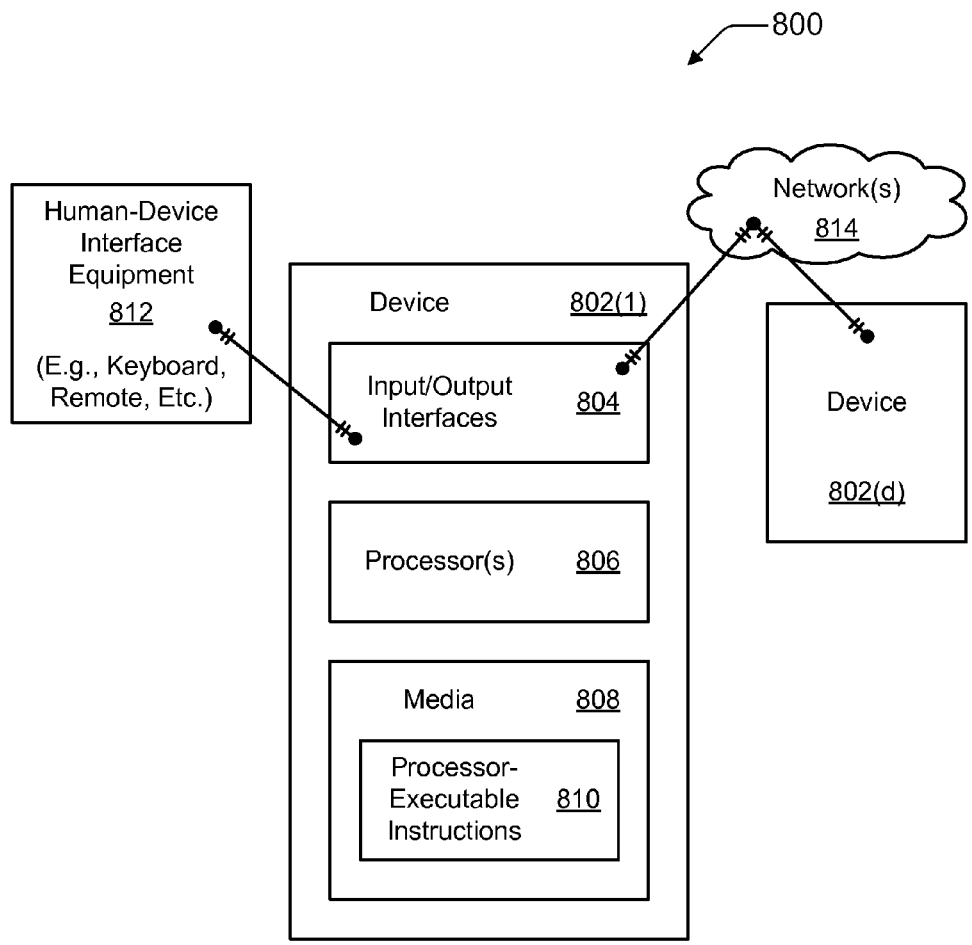
FIG. 8 is a block diagram of an example device that may be used to implement embodiment(s) for replaying distributed systems as described herein.

FIG. 8 is a block diagram 800 of an example device 802 that may be used to implement embodiment(s) for replaying distributed systems as described herein. For example, a distributed system simulator 102 (of FIG. 1) may be implemented on a device 802. As illustrated, two devices 802(1) and 802(d) are capable of engaging in communications via network(s) 814. Although two devices 802 are specifically shown, one or more than two devices 802 may be employed, depending on implementation. Network(s) 814 may be, by way of example but not limitation, an internet, an intranet, an Ethernet, a public network, a private network, a cable network, a digital subscriber line (DSL) network, a telephone network, a Fibre network, a Grid computer network, an avenue to connect to such a network, a wireless network, a mesh network, some combination thereof, and so forth. Alternatively, two devices 802 may be directly connected.

Generally, a device 802 may represent any computer or processing-capable device, such as a server device; a workstation or other general computer device; a data storage repository apparatus; a personal digital assistant (PDA); a mobile phone; a gaming platform; an entertainment device; a router computing node; a mesh or other network node; a wireless access point; some combination thereof; and so forth. As illustrated, device 802 includes one or more input/output (I/O) interfaces 804, at least one processor 806, and one or more media 808. Media 808 include processor-executable instructions 810.

In an example embodiment of device 802, I/O interfaces 804 may include (i) a network interface for communicating across network 814, (ii) a display device interface for displaying information on a display screen, (iii) one or more human-device interfaces, and so forth. Examples of (i) network interfaces include a network card, a modem, one or more ports, a network communications stack, a radio, and so forth. Examples of (ii) display device interfaces include a graphics driver, a graphics card, a hardware or software driver for a screen or monitor, and so forth. Examples of (iii) human-device interfaces include those that communicate by wire or wirelessly to human-device interface equipment 812 (e.g., a keyboard, a remote, a mouse or other graphical pointing device, etc.).

Generally, processor 806 is capable of executing, performing, and/or otherwise effectuating processor-executable instructions, such as processor-executable instructions 810. Media 808 is comprised of one or more processor-accessible media. In other words, media 808 may include processor-executable instructions 810 that are executable by processor 806 to effectuate the performance of functions by device 802. Processor-executable instructions may be embodied as software, firmware, hardware, fixed logic circuitry, some combination thereof, and so forth.

Thus, realizations for replaying distributed systems may be described in the general context of processor-executable instructions. Generally, processor-executable instructions include routines, programs, applications, coding, modules, protocols, objects, components, metadata and definitions thereof, data structures, application programming interfaces (APIs), etc. that perform and/or enable particular tasks and/or implement particular abstract data types. Processor-executable instructions may be located in separate storage media, executed by different processors, and/or propagated over or extant on various transmission media.

Processor(s) 806 may be implemented using any applicable processing-capable technology, and one may be realized as a general purpose processor (e.g., a central processing unit (CPU), a microprocessor, a controller, etc.), a graphics processing unit (GPU), a derivative thereof, and so forth. Media 808 may be any available media that is included as part of and/or accessible by device 802.1t includes volatile and non-volatile media, removable and non-removable media, storage and transmission media (e.g., wireless or wired communication channels), hard-coded logic media, combinations thereof, and so forth. Media 808 is tangible media when it is embodied as a manufacture and/or as a composition of matter. For example, media 808 may include an array of disks or flash memory for longer-term mass storage of processor-executable instructions 810, random access memory (RAM) for shorter-term storing of instructions that are currently being executed and/or otherwise processed, link(s) on network 814 for transmitting communications, and so forth.

As specifically illustrated, media 808 comprises at least processor-executable instructions 810. Generally, processor-executable instructions 810, when executed by processor 806, enable device 802 to perform the various functions described herein. Such functions include, but are not limited to: (i) those acts that are illustrated in flow diagrams 400 and 700 (of FIGS. 4 and 7); (ii) those of a distributed system simulator 102 (of FIGS. 1, 2, et seq.); (iii) those undertaken to replay a distributed system (e.g., as shown in FIGS. 3, 5, and 6); other schemes and techniques described herein; combinations thereof; and so forth.

The devices, acts, aspects, features, functions, procedures, modules, data structures, techniques, components, parts, etc. of FIGS. 1-8 are illustrated in diagrams that are divided into multiple blocks and other elements. However, the order, interconnections, interrelationships, layout, etc. in which FIGS. 1-8 are described and/or shown are not intended to be construed as a limitation, and any number of the blocks and/or other elements can be modified, combined, rearranged, augmented, omitted, etc. in any manner to implement one or more systems, methods, devices, procedures, media, apparatuses, arrangements, etc. for replaying distributed systems.

Although systems, media, devices, methods, procedures, apparatuses, mechanisms, schemes, approaches, processes, arrangements, and other example embodiments have been described in language specific to structural, logical, algorithmic, and functional features and/or diagrams, it is to be understood that the invention defined in the appended claims is not necessarily limited to the specific features or acts described above. Rather, the specific features and acts described above are disclosed as example forms of implementing the claims.

What is claimed is:

1. A device comprising:
    a processor;
    a simulation controller that simulates a distributed system having a first instance and a second instance, the simulation controller being configured to receive as inputs, a first trace log and a second trace log that correspond respectively to the first instance and the second instance, the first trace log and the second trace log each including nondeterministic events derived from an operation of the distributed system;
    a first simulation object corresponding to the first instance and a first memory area that is associated with the first simulation object; and
    a second simulation object corresponding to the second instance and a second memory area that is associated with the second simulation object;
    wherein the simulation controller is further configured to direct a single simulation process of the nondeterministic events by switching from the first memory area to the second memory area and use function calls to communicate information between the first simulation object and the second simulation object.

2. The device as recited in claim 1, wherein the simulation controller uses at least some of the function calls to simulate messages that are communicated between the first instance and the second instance of the distributed system during the operation of the distributed system.

3. The device as recited in claim 1, wherein the simulation controller is further configured to orchestrate the function calls to maintain a happened-before timing of the nondeterministic events and switch from the first memory area to the second memory area when a first nondeterministic event associated with the first memory area is followed by a second nondeterministic event associated with the second memory area in the single simulation process.

4. The device as recited in claim 1, wherein the operation is a real-world operation.

5. The device as recited in claim 1, wherein the simulation controller replays the operation of the distributed system by feeding the non-deterministic events from the first trace log to the first simulation object and from the second trace log to the second simulation object.

6. The device as recited in claim 1, wherein
the first memory area and
the second memory area are separately maintained during the single simulation process.

7. The device as recited in claim 6, wherein the first memory area contains a first memory-mapped file comprising data corresponding to the first simulation object, and the second memory area contains a second memory-mapped file comprising data corresponding to the second simulation object.

8. The device as recited in claim 6, wherein the simulation controller is configured to direct the single simulation process by changing a value in a page mapping table.

9. A computer-implemented method comprising:
receiving a first trace log corresponding to a first instance, and a second trace log corresponding to a second instance, the first trace log and the second trace log including data derived from an operation of a distributed system;
simulating the first instance of the distributed system in a single simulation process;
simulating the second instance of the distributed system in the single simulation process;
simulating messages transferred between the first instance and the second instance of the distributed system as intra-process function calls within the single simulation process; and
switching simulation process memory from a first memory-mapped file corresponding to the first instance to a second memory-mapped file corresponding to the second instance when simulation of the distributed system switches from the first instance to the second instance based at least in part on an intra-process function call.

10. The method as recited in claim 9, wherein the method further comprises implementing a simulation controller in the single simulation process.

11. The method as recited in claim 9, wherein the method further comprises:
memory mapping a first file that is associated with a first instance state to create the first memory-mapped file, the first instance state corresponding to the first instance; and
memory mapping a second file that is associated with a second instance state to create the second memory-mapped file, the second instance state corresponding to the second instance.

12. The method as recited in claim 9, wherein the switching comprises:
in a page table having a page reference entry associated with the simulation process memory, replacing in the page reference entry a first value pointing to the first memory-mapped file with a second value pointing to the second memory-mapped file.

13. The method as recited in claim 9, wherein the simulating messages comprises:
implementing the intra-process function calls as thread-level calls.

14. The method as recited in claim 9, wherein the simulating messages comprises:
implementing the intra-process function calls between a first simulation object corresponding to the first instance and a second simulation object corresponding to the second instance without using an operating system call.

15. One or more processor-accessible storage media comprising processor-executable instructions stored thereon, that comprise:
a distributed system simulator to simulate operation of a distributed system that includes multiple instances, wherein the distributed system simulator simulates the multiple instances within a single simulation process using function calls to simulate communications between the multiple instances; and
multiple trace logs that correspond respectively to the multiple instances, each trace log including data derived from an operation of the distributed system;
wherein the distributed system simulator:
applies the data from the multiple trace logs to the multiple instances of the single simulation process during a simulated operation; and
switches from a first memory-mapped file corresponding to a first instance to a second memory-mapped file corresponding to a second instance during the single simulation process.

16. The one or more processor-accessible storage media as recited in claim 15, wherein the operation is a real-world operation.

17. The one or more processor-accessible storage media as recited in claim 15, further comprising:
multiple instance state files that correspond respectively to the multiple instances, each instance state file of the multiple instance state files including a current state of the corresponding instance, wherein the distributed system simulator memory maps the multiple instance state files into separate memory-mapped files.

18. The one or more processor-accessible storage media as recited in claim 17, wherein the distributed system simulator changes at least one value in a page reference entry of a page mapping table to switch from the first memory-mapped file corresponding to the first instance to the second memory-mapped file corresponding to the second instance, the page reference entry of the page mapping table being associated with the single simulation process.

* * * * *